United States Patent
Lin et al.

(10) Patent No.: US 7,532,472 B2
(45) Date of Patent: May 12, 2009

(54) HEAT DISSIPATION DEVICE

(75) Inventors: Yu-Chen Lin, Taipei Hsien (TW); Hong-Bo Xu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/564,269

(22) Filed: Nov. 28, 2006

(65) Prior Publication Data

US 2007/0242433 A1 Oct. 18, 2007

(30) Foreign Application Priority Data

Apr. 14, 2006 (CN) .................. 2006 1 0060295

(51) Int. Cl.
*H05K 7/20* (2006.01)
*H01L 23/36* (2006.01)

(52) U.S. Cl. .................. 361/697; 361/704; 361/709; 165/80.3; 165/104.33

(58) Field of Classification Search ......... 361/687–689, 361/690–697, 702–712, 717–722; 165/80.2, 165/80.3, 80.4, 80.5, 104.33, 104.34, 121–126, 165/185; 257/706–727; 415/178, 211.1, 415/55.5, 61, 66, 211.2, 213.1, 186, 208.4; 174/15.1, 15.2, 16.3, 252; 24/500, 502, 544, 24/615, 625; D13/179; D23/370, 379, 411
See application file for complete search history.

(56) References Cited

U.S. PATENT DOCUMENTS

| | | | |
|---|---|---|---|
| 6,336,499 B1 * | 1/2002 | Liu | 165/80.3 |
| 6,343,014 B1 * | 1/2002 | Lin | 361/697 |
| 6,407,919 B1 * | 6/2002 | Chou | 361/697 |
| 6,547,540 B1 * | 4/2003 | Horng et al. | 417/423.14 |
| 6,557,626 B1 * | 5/2003 | O'Sullivan et al. | 165/121 |
| D478,875 S * | 8/2003 | Lee | D13/179 |
| 6,657,862 B2 * | 12/2003 | Crocker et al. | 361/697 |
| 6,662,412 B2 * | 12/2003 | Chuang et al. | 24/457 |
| 6,671,172 B2 * | 12/2003 | Carter et al. | 361/697 |
| 6,712,127 B2 * | 3/2004 | Lee | 165/80.3 |
| 6,714,415 B1 | 3/2004 | Shah | |
| D491,260 S * | 6/2004 | Luo | D23/411 |
| 6,782,941 B2 * | 8/2004 | Lee | 165/80.3 |
| D500,745 S * | 1/2005 | Duan et al. | D13/179 |
| 6,886,627 B2 * | 5/2005 | Kozyra et al. | 165/80.3 |
| 6,896,046 B2 * | 5/2005 | Lee et al. | 165/185 |
| 6,924,982 B2 * | 8/2005 | Chen et al. | 361/697 |

(Continued)

FOREIGN PATENT DOCUMENTS

JP 2005158812 A * 6/2005

*Primary Examiner*—Michael V Datskovskiy
(74) *Attorney, Agent, or Firm*—Frank R. Niranjan

(57) ABSTRACT

A heat dissipation device (100) comprises a heat sink (10) and a fan (40) mounted on the heat sink (10). The heat sink (10) comprises a central core (12), a plurality of branches (122) radially extending outwardly from a periphery of the core (12) and a plurality of fins (14) extending from of the core (12) and the branches (122). The fan (40) comprises a plurality of blades (404). The branches (122) and the fins (14) extend and are oriented in a direction opposite to a rotation direction of the blades (404) of the fan (40).

6 Claims, 6 Drawing Sheets

U.S. PATENT DOCUMENTS

| | | | |
|---|---|---|---|
| D509,483 S * | 9/2005 | Watanabe et al. | D13/179 |
| D511,326 S * | 11/2005 | Watanabe et al. | D13/179 |
| D516,526 S * | 3/2006 | Watanabe et al. | D13/179 |
| 7,038,913 B2 * | 5/2006 | Lee et al. | 361/709 |
| 7,055,578 B2 * | 6/2006 | Ku et al. | 165/80.3 |
| 7,113,403 B2 * | 9/2006 | Kuo et al. | 361/697 |
| 7,123,483 B2 * | 10/2006 | Otsuki et al. | 361/710 |
| 7,150,311 B2 * | 12/2006 | Liu | 165/80.3 |
| 7,160,080 B2 * | 1/2007 | Lin | 415/177 |
| D537,418 S * | 2/2007 | Watanabe et al. | D13/179 |
| 7,178,587 B2 * | 2/2007 | Liu | 165/185 |
| 7,188,418 B2 * | 3/2007 | Shah | 29/890.05 |
| 7,281,893 B2 * | 10/2007 | Pan | 415/177 |
| 7,289,330 B2 * | 10/2007 | Lu et al. | 361/710 |
| D561,120 S * | 2/2008 | Chen et al. | D13/179 |
| D561,122 S * | 2/2008 | Mochizuki et al. | D13/179 |
| D561,123 S * | 2/2008 | Mochizuki et al. | D13/179 |
| D561,124 S * | 2/2008 | Mochizuki et al. | D13/179 |
| 7,331,756 B2 * | 2/2008 | Watanabe et al. | 415/191 |
| D564,460 S * | 3/2008 | Otsuki et al. | D13/179 |
| 7,411,327 B2 * | 8/2008 | Watanabe et al. | 310/71 |
| 2007/0146995 A1 * | 6/2007 | Zhao et al. | 361/697 |
| 2007/0181288 A1 * | 8/2007 | Chen et al. | 165/80.3 |

* cited by examiner

HEAT DISSIPATION DEVICE

BACKGROUND OF THE INVENTION

The present invention relates generally to a heat dissipation device, and more particularly to a heat sink with low heat resistance.

DESCRIPTION OF RELATED ART

Electronic devices such as central processing units (CPUs) generate a lot of heat during normal operation. If the heat generated by the electronic devices is not timely and properly dissipated, it can affect their operational stability and damage associated electronic devices. Thus the heat must be removed quickly and efficiently to ensure the normal operation of these electronic devices. A heat dissipation device is often attached to a top surface of the CPU to remove heat therefrom.

FIG. 6 discloses a related heat dissipation device. The heat dissipation device includes a heat sink and a fan attached to a top portion of the heat sink. The heat sink includes a base contacting with the CPU and a plurality of fins upwardly extending from a top of the heat sink for facilitating heat convection. Blades of the fan revolve and create an axial airflow. The direction of such airflow is related to the orientation of the blades. When such air enters the heat sink, it strikes the straight fins, rebounds, and thus creates obstructing airflow. Additionally, part of the air emitted by the fan strikes a bottom portion of the base being relatively close to the CPU, rebounds back toward the fan and creates obstructing airflow. All this prevents air from entering the heat sink and exiting the heat sink, and thus reduces efficiency of forced heat convection. Thus the heat dissipation efficiency of the heat sink is reduced.

SUMMARY OF THE INVENTION

A heat dissipation device comprises a heat sink and a fan mounted on the heat sink. The heat sink comprises a central core, a plurality of branches radially extending outwardly from peripheries of the core, and a plurality of fins extending from the core and the branches. The fan comprises a plurality of blades. The branches and the fins extend and are oriented in a direction opposite to a rotational direction of the blades of the fan.

Other advantages and novel features of the present heat dissipation device will become more apparent from the following detailed description of preferred embodiment when taken in conjunction with the accompanying drawings, in which:

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION OF THE INVENTION

Figure 1:
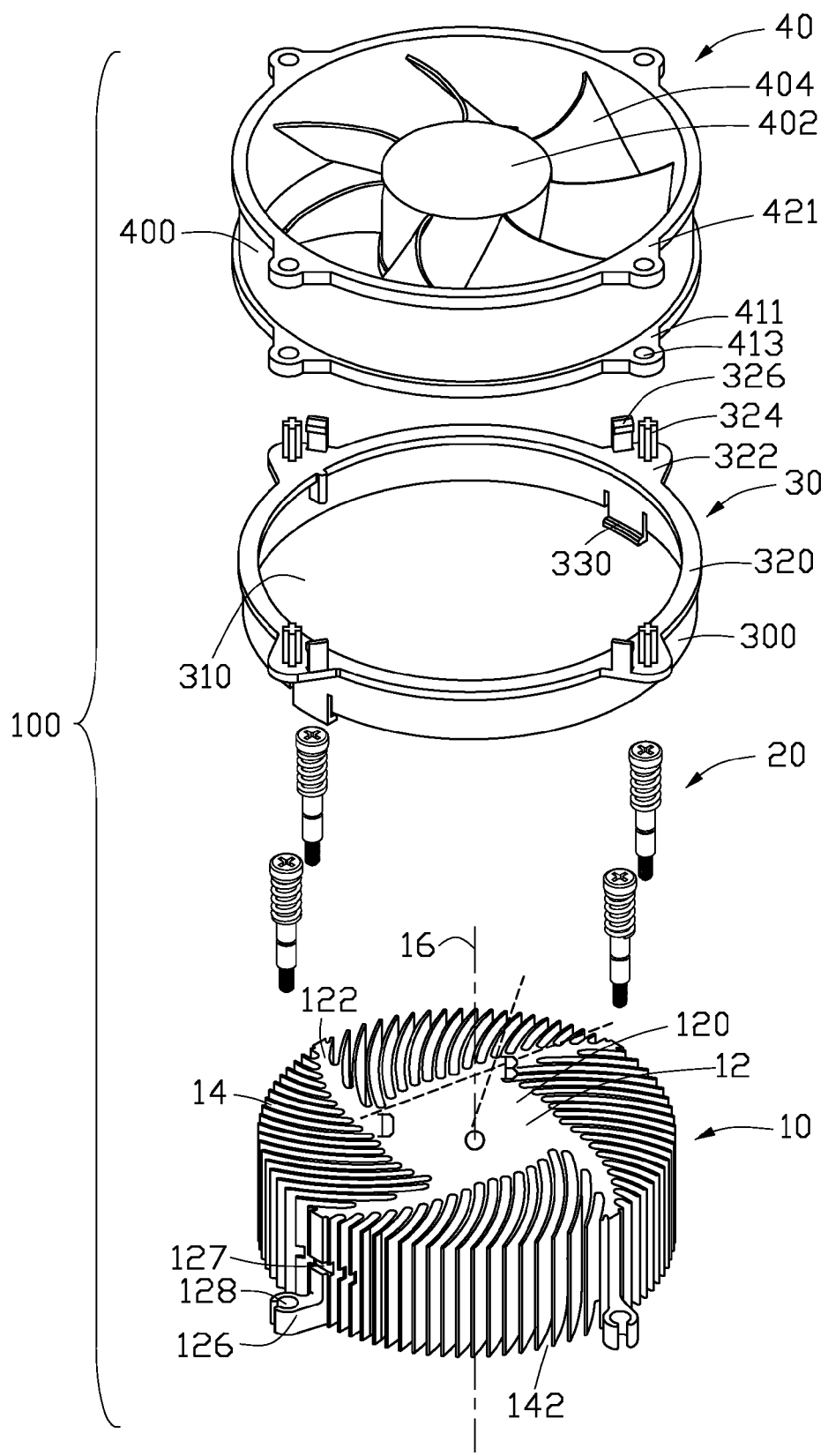
FIG. 1 is an exploded, isometric view of a heat dissipation device in accordance with a preferred embodiment of the present heat dissipation device.

As shown in FIG. 1, a heat dissipation device 100 in accordance with a preferred embodiment of the present heat dissipation device adapted to dissipate heat generated by an electrical component, such as a CPU (not shown) on a printed circuit board (not shown) comprises a heat sink 10, four fasteners 20, a fan bracket 30 and a fan 40. The fan bracket 30 is employed to secure the fan 40 to a top surface of the heat sink 10. The fan 40 includes a plurality of blades 404. The combined heat sink 10, fan bracket 30 and fan 40 are attached to the CPU by the four fasteners 20.

The heat sink 10 has a cylindrical configuration and comprises a central core 12 with a shape similar to a cube and four curved symmetrical branches 122 radially extending outwardly from four vertical edges of the core 12. The core 12 comprises four outer side surfaces (not labeled) separated by the branches 122. Each branch 122 comprises an outer side surface (not labeled) and an inner side surface (not labeled). The four outer side surfaces of the core 12 and the side surfaces of the four branches 122 cooperatively define four regions. A plurality of curved fins 14 extend outwardly from side surfaces of the core 12 and the branches 122. From a top-down view, the side surfaces of the core 12 and the branches 122 in each region are smoothly connected and form an inverse L-like projection. The fins 14 in different regions are oriented towards four different directions. In each region, the curved branches 122 and fins 14 extend and are oriented in a same direction, such as, for example, clockwise. The central core 12 comprises a top surface 120 and a bottom surface (not shown) configured for absorbing heat from the CPU. The core 12 has a central axis 16 as indicated by a dashed line in FIG. 1. The central axis 16 is oriented perpendicular to the top surface 120 of the core 12. Point O shows a crossing point of the axis 16 and the top surface 120, as well as a center of the top surface 120. A first imaginary straight line OB is formed by joining point O and a crossing point B of each vertical edge of the core 12 and the top surface 120 corresponding to each branch 122. Each branch 122 deviates from the corresponding line OB towards a same side as other branches 122, such as the clockwise side of the line OB in the embodiment. Another second imaginary straight line BD is formed by joining the corresponding point B of each vertical edge and another adjacent crossing point D of the vertical edge on a counterclockwise side of each region and the top surface 120. Each branch 122 deviates from the corresponding line BD towards the same side as for the line OB, such as the clockwise direction in the preferred embodiment. The fins 14 in the same region are spaced from each other by uniform intervals, thus defining a plurality of airflow passages 142 therebetween. Furthermore, the fins 14 deviate from the corresponding branch 122 located on the counterclockwise side in each region towards a same side as the branch 122, such as the clockwise direction in the embodiment. In each region, the fins 14 extending from each side surface of the core 12 gradually become shorter along the curving direction of the adjacent branches 122.

Four protrusions 126 extend outwardly from lower portions of the branches 122. Each protrusion 126 is C-shaped and has a through hole 128 defined therein. The four fasteners 20 are adapted to engage in the through holes 128, for facilitating an attachment of the heat sink 10 onto the printed circuit board. Two recesses 127 are symmetrically defined in a circumferential periphery of the heat sink 10. In the embodiment the recesses 127 are defined in a middle level of the heat sink 10, and are defined by cutting away outer ends of two symmetrical branches 122 and the fins 14 adjacent to the two symmetrical branches 122.

The fan bracket 30 comprises a tubular frame 300 defining a central opening 310 therein. An annular flange 320 extends horizontally and outwardly from an upper edge of the frame 300 for supporting the fan 40 thereon. Four symmetrical ears 322 extend horizontally and outwardly from an outer edge of the flange 320. A pin 324 and a latch 326 extend perpendicularly and upwardly from each ear 322. The pin 324 and the latch 326 of each ear 322 are spaced from each other. Two symmetrical catches 330 extend downwardly from a lower edge of the frame 300, for engaging in the recesses 127 to firmly secure the fan bracket 30 to the heat sink 10. In the embodiment, the catches 330 are arranged below the two opposite ears 322.

The fan 40 is mounted on the heat sink 10 with the help of the fan bracket 30. The fan 40 has a substantially tubular housing 400 and a hub 402 received in the housing 400. A plurality of blades 404 radially extend from the hub 402. The housing 400 is provided with four pairs of tabs 411, 421 extending outwardly and horizontally from upper and lower edges of the housing 400. The tabs 411 each define a locating hole 413 therein. The holes 413 receive the pins 324 of the fan bracket 30 therein to position the fan 40 onto the fan bracket 30 in a horizontal direction. The tabs 411 are hooked by the latches 326 of the fan bracket 30 to hold the fan 40 on the fan bracket 30 in a vertical direction. The blades 404 of the fan 40 are configured to rotate in a direction opposite to the extension direction of the curved branches 122 and fins 14, such as the counterclockwise direction in the preferred embodiment.

Figure 2:
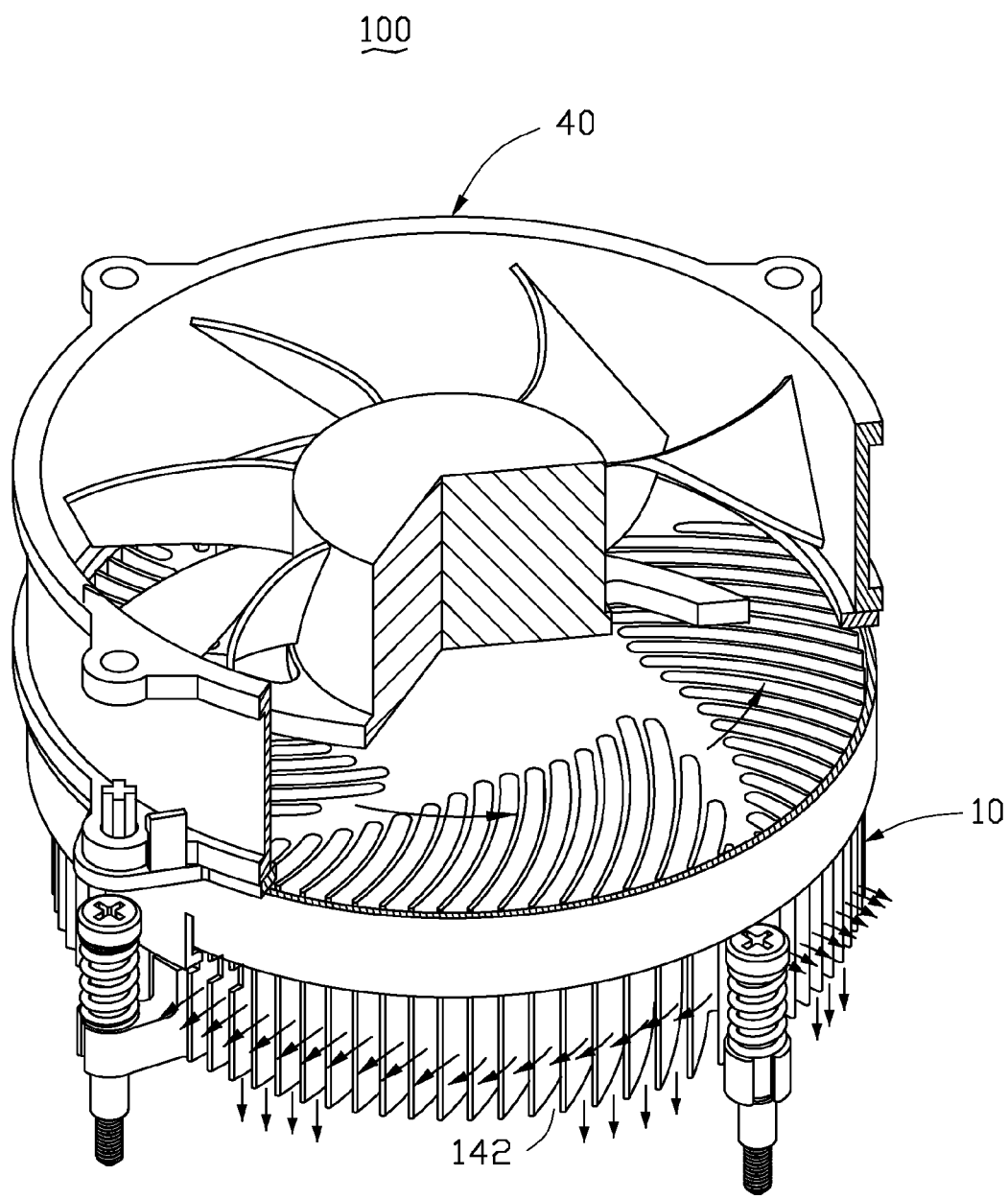
FIG. 2 is an assembled view of FIG. 1, wherein a fan of the heat dissipation device is shown partly cut away.

As shown in FIG. 2, in use, heat generated by the CPU is firstly conducted to the core 12 and the fins 14 of the heat sink 10. During operation of the fan 40, a large amount of cooling air is drawn into the housing 400 of the fan 40 and then toward the heat sink 10 via the opening 310 of the fan bracket 30. Arrows show flow directions of airflow generated by the fan 40, corresponding to a clockwise rotation direction of the blades 404. The airflow enters the heat sink 10 within the airflow passages 142 and takes away heat from the core 12 and the fins 14. Because the curved branches 122 and the fins 14 extend and are oriented in a direction opposite to the rotation direction of the blades 404 of the fan 40, the airflow can be conducted into the core 122 more easily, allowing more airflow to impinge on the core 122 and the fins 14. Thus, the heat on the heat sink 10 can be quickly transferred to the airflow and dissipated to the surroundings along with the airflow from the heat sink 10.

Figure 3:
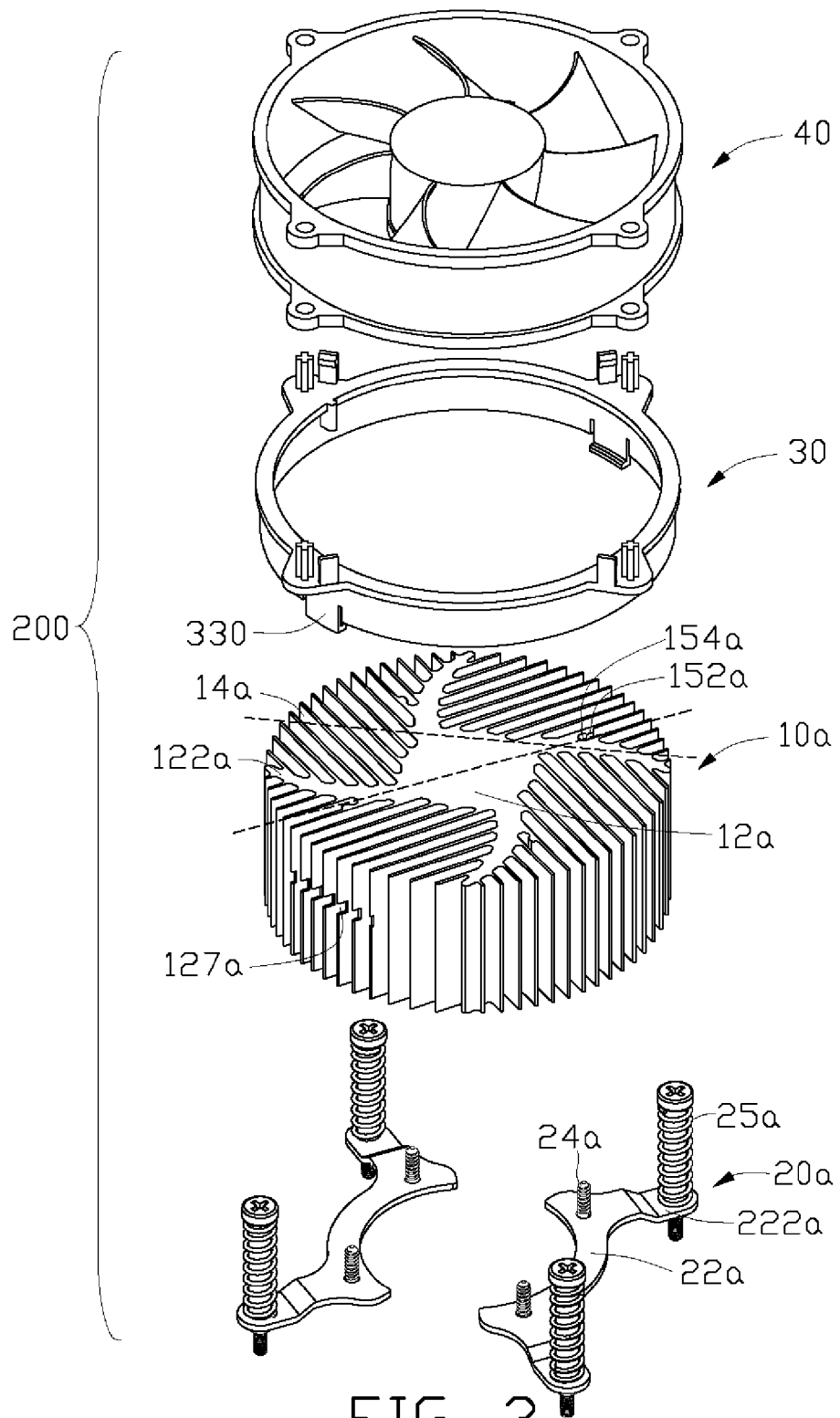
FIG. 3 is an exploded, isometric view of a heat dissipation device in accordance with a second embodiment of the present heat dissipation device.

Referring to FIG. 3, a heat dissipation device 200 in accordance with a second embodiment of the present heat dissipation device is illustrated. The heat dissipation device 200 comprises a heat sink 10a, two clips 20a, a fan bracket 30 and a fan 40, and has a configuration similar to that of the first preferred embodiment. The heat sink 10a comprises a central core 12a and four branches 122a having the same configuration as the corresponding ones of the first preferred embodiment. The main difference therebetween is that a plurality of fins 14a extending from side surfaces of the core 12a and the branches 122a are straight. The fins 14a in each region defined by the core 12a and the branches 122a are parallel to each other. The fins 14a in different regions are perpendicular to the fins 14a in the adjacent regions. Furthermore, the fins 14a deviate from the corresponding branch 122a located on the counterclockwise side in each region towards a same side as the branch 122a, such as the clockwise direction in the second embodiment. In each region, a protrusive portion 152a is formed on an edge of one fin 14a, being adjacent to the branch 122a. The protrusive portion 152a and the branch 122a cooperatively define a half-closed hole 154a extending through from a top surface to a bottom surface of the heat sink 10a. Two recesses 127a are symmetrically defined in a circumferential periphery in the two opposite regions of the heat sink 10a.

Each clip 20a comprises a C-like base 22a. Two self-tapping screws 24a extending upwardly from respective ends of the base 22a are adapted to engage in the half-closed holes 154a from the bottom surface of the heat sink 10a. Thus the clips 20a are attached to the heat sink 10a securely. Two ears 222a extend outwardly from two side edges of the ends of the base 22a respectively in a roughly horizontal direction. Each ear 222a defines an aperture (not shown) for engaging with a fastener 25a used to secure the clip 20a to the printed circuit board.

Figure 4:
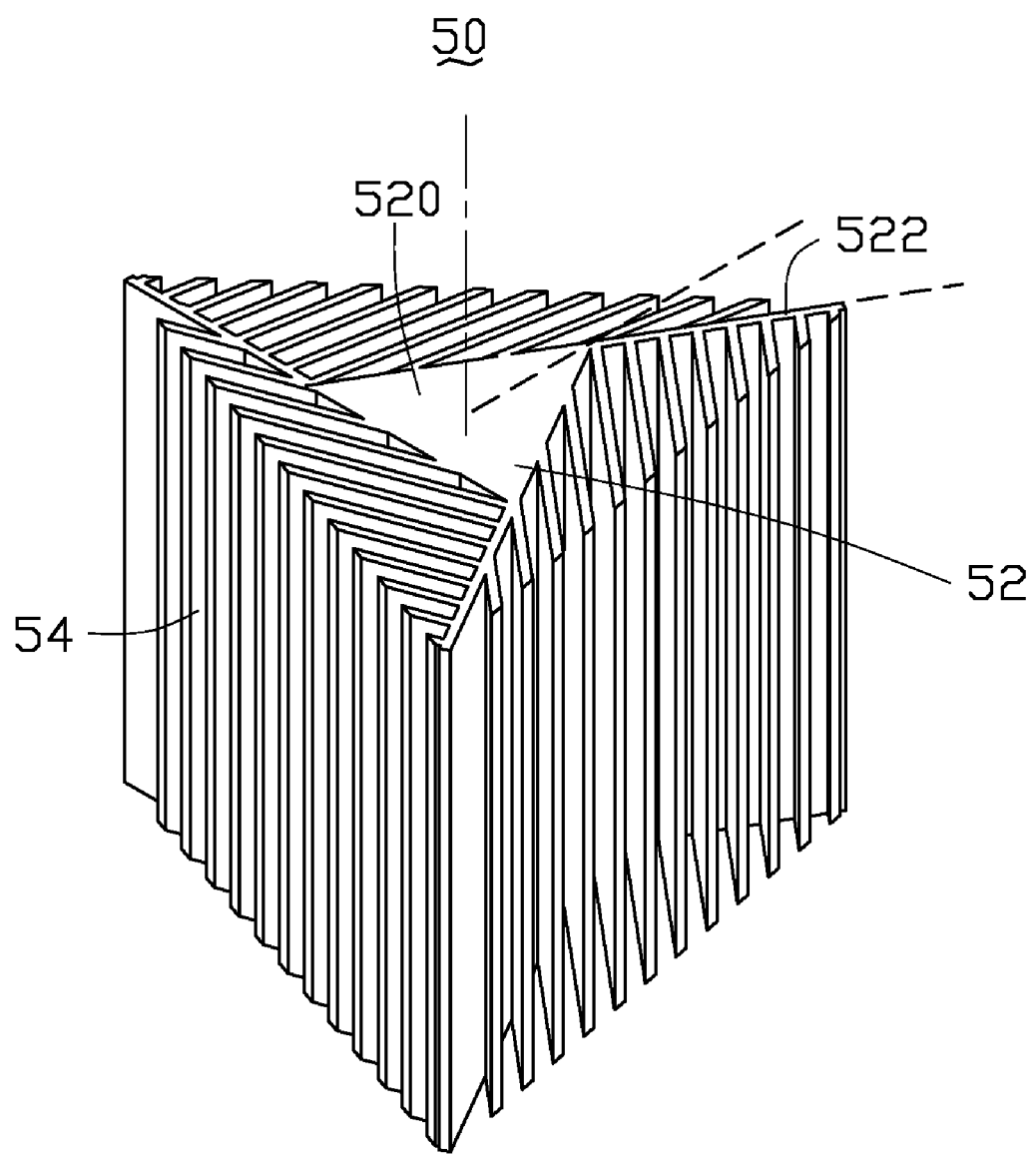
FIG. 4 is an isometric view of a heat sink of a heat dissipation device in accordance with a third embodiment of the present heat dissipation device.

It can be understood that the shape of the core 12 of the heat sink 10 can be prism-like, cylindrical, or parallelepiped, and is not limited to being cube-shaped. Referring to FIG. 4, a heat sink 50 of a heat dissipation device in accordance with a third embodiment of the present heat dissipation device is illustrated. Different from the heat sink 10 of the first preferred embodiment, the heat sink 50 comprises a central core 52 with a shape as a triangular prism and three straight branches 522 radially extending outwardly from and along three sides of the core 52, respectively. Furthermore, each branch 522 deviates from an imaginary line formed by joining a center of the top surface 520 of the core 52 and a corresponding vertex of the central core 52, towards a same side as other branches 522, such as the clockwise direction side of the line in the third embodiment. A plurality of straight fins 54 extend outwardly from side surfaces of the core 52 and the branches 522, and are divided into three regions oriented in three different directions. The fins 54 in each region defined by the core 52 and the branches 522 are parallel to each other. Furthermore, the fins 54 deviate from the corresponding branch 522 located on the counterclockwise side in each region towards a same side as the fins 54 in other regions, such as the clockwise direction in the third embodiment.

Figure 5:
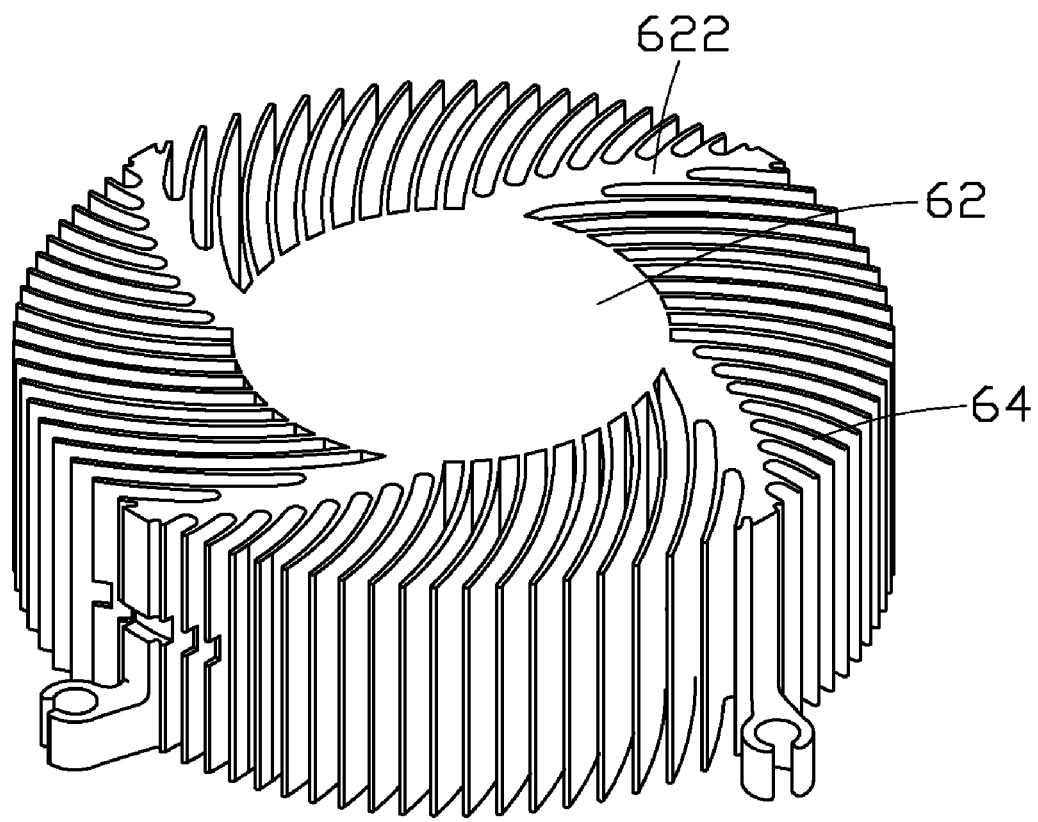
FIG. 5 is an isometric view of a heat sink of a heat dissipation device in accordance with a fourth embodiment of the present heat dissipation device.
Figure 6:
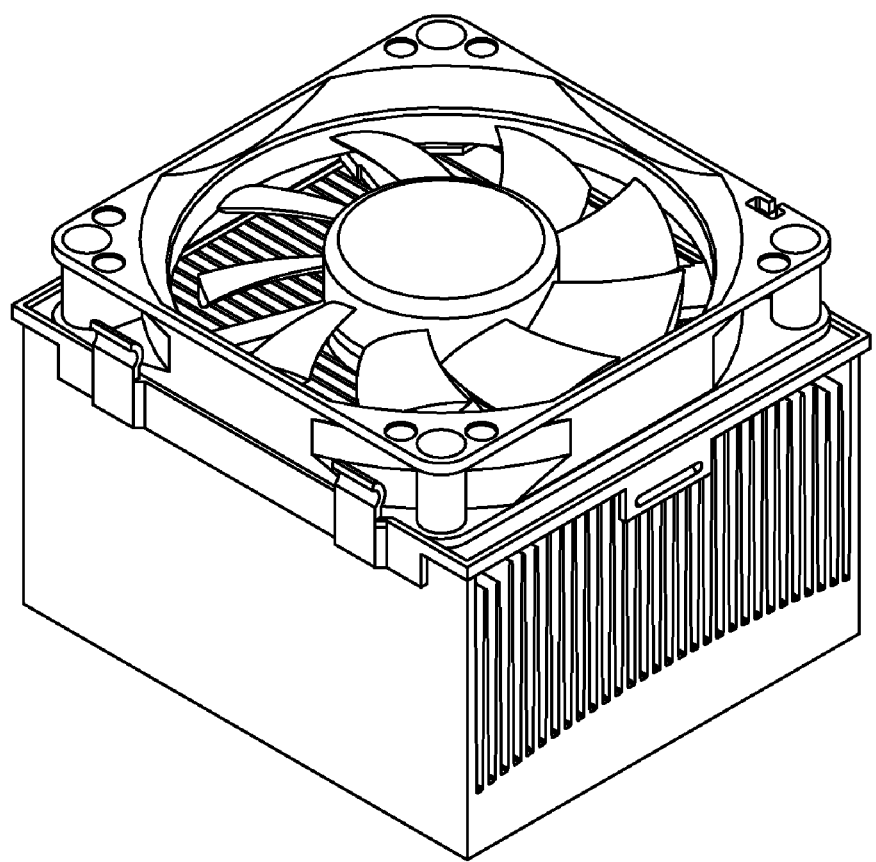
FIG. 6 is an assembled, isometric view of a related heat dissipation device.

Referring to FIG. 5, a heat sink 60 of a heat dissipation device in accordance with a fourth embodiment of the present heat dissipation device is illustrated. The heat sink 60 has a configuration similar to the heat sink 10 of the first preferred embodiment. The main difference therebetween is that the heat sink 60 has a cylinder-like core 62. Four branches 622 and a plurality of fins 64 extend out from a circumferential periphery (not labeled) of the core 62 in the same manner as that of the first preferred embodiment. Furthermore, the branches 622 can radially extend outwardly from the circumferential periphery of the core 62 in a tangential direction to the circumferential periphery of the core 62.

It can be understood that the curving directions of the branches 122, 122a, 522, 622 and the fins 14, 14a, 54, 64 all extend and are oriented opposite to the rotation direction of the blades 404 of the fan 40. Thus the airflow generated by the fan 40 can be conducted into the core 12, 12a, 52, 62 more easily, allowing more airflow to impinge on the core 12, 12a, 52, 62 and the fins 14, 14a, 54, 64. Therefore, the heat on the heat sink 10, 10a, 50, 60 can be quickly transferred to the airflow and dissipated to the surroundings along with the airflow from the heat sink 10, 10a, 50, 60.

It is to be understood, however, that even though numerous characteristics and advantages of the present heat dissipation device have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink comprising:
   a central core having a plurality of branches radially extending outwardly from a periphery thereof, wherein
   a plurality of first imaginary lines corresponding to the branches is each formed by joining a center of a top surface of the core and a crossing point of each branch and the top surface of the core; a plurality of second imaginary lines is each formed by joining the crossing point of each branch and the top surface of the core and an adjacent crossing point of an adjacent branch and the top surface; each branch deviates from a corresponding first imaginary line towards a same side as other branches;
   wherein a plurality of fins extend from the core and the branches, and a plurality of regions are cooperatively defined by the core and the branches, and the fins have ends thereof defining a plurality of spaced recesses engagingly receiving corresponding catches of a fan bracket; and
   wherein the branches define a plurality of spaced, half-closed holes each being located between two adjacent fins, a clip being located at a bottom of the heat sink and having screws received in the holes, the clip being adapted for securing the heat sink to a printed circuit board.

2. The heat sink as claimed in claim 1, wherein a fan comprising a plurality of blades is mounted on the heat sink, the branches and the fins extend and are oriented opposite to a rotation direction of the blades of the fan.

3. The heat sink as claimed in claim 2, wherein each branch is curved and deviates from a corresponding second imaginary line towards the same side as is deviated from the corresponding first imaginary line.

4. The heat sink as claimed in claim 2, wherein in each region, the fins deviate from a corresponding branch towards the same side.

5. The heat sink as claimed in claim 4, wherein the fins have one of curved shape and straight shape.

6. A heat sink comprising:
   a central core having a plurality of branches radially extending outwardly from a periphery thereof, wherein
   a plurality of first imaginary lines corresponding to the branches is each formed by joining a center of a top surface of the core and a crossing point of each branch and the top surface of the core; a plurality of second imaginary lines is each formed by joining the crossing point of each branch and the top surface of the core and an adjacent crossing point of an adjacent branch and the top surface; each branch deviates from a corresponding first imaginary line towards a same side as other branches, each branch extending outwardly along a corresponding second imaginary line.

\* \* \* \* \*